(12) United States Patent
Chung et al.

(10) Patent No.: US 11,940,737 B2
(45) Date of Patent: *Mar. 26, 2024

(54) METHOD OF FABRICATING RETICLE

(71) Applicant: TAIWAN SEMICONDUCTOR MANUFACTURING CO., LTD., Hsinchu (TW)

(72) Inventors: Hsueh-Yi Chung, Hsinchu County (TW); Yung-Cheng Chen, Hsinchu County (TW); Fei-Gwo Tsai, Taipei (TW); Chi-Hung Liao, New Taipei (TW); Shih-Chi Fu, Hsinchu County (TW); Wei-Ti Hsu, Hsinchu County (TW); Jui-Ping Chuang, Hsinchu (TW); Tzong-Sheng Chang, Hsinchu County (TW); Kuei-Shun Chen, Hsinchu (TW); Meng-Wei Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 107 days.

This patent is subject to a terminal disclaimer.

(21) Appl. No.: 17/315,087

(22) Filed: May 7, 2021

(65) Prior Publication Data
US 2021/0263425 A1    Aug. 26, 2021

Related U.S. Application Data

(60) Continuation of application No. 16/740,256, filed on Jan. 10, 2020, now Pat. No. 11,003,091, which is a
(Continued)

(51) Int. Cl.
G03F 7/20 (2006.01)
G03F 1/50 (2012.01)
(Continued)

(52) U.S. Cl.
CPC ............ G03F 7/70433 (2013.01); G03F 1/50 (2013.01); G03F 1/68 (2013.01); G03F 1/70 (2013.01);
(Continued)

(58) Field of Classification Search
CPC .... G03F 7/70433; G03F 7/20; G03F 7/70141; G03F 7/70158; G03F 7/70716;
(Continued)

(56) References Cited

U.S. PATENT DOCUMENTS

| | | |
|---|---|---|
| 4,758,863 A | 7/1988 | Nikkel |
| 5,695,897 A | 12/1997 | Mitome et al. |

(Continued)

*Primary Examiner* — Christina A Riddle
(74) *Attorney, Agent, or Firm* — Maschoff Brennan

(57) ABSTRACT

A method includes receiving a device design layout and a scribe line design layout surrounding the device design layout. The device design layout and the scribe line design layout are rotated in different directions. An optical proximity correction (OPC) process is performed on the rotated device design layout and the rotated scribe line design layout. A reticle includes the device design layout and the scribe line design layout is formed after performing the OPC process.

20 Claims, 10 Drawing Sheets

US 11,940,737 B2
Page 2

Related U.S. Application Data division of application No. 16/127,017, filed on Sep. 10, 2018, now Pat. No. 10,534,272, which is a continuation of application No. 14/706,871, filed on May 7, 2015, now Pat. No. 10,073,354.

(60) Provisional application No. 62/072,250, filed on Oct. 29, 2014.

(51) Int. Cl.
*G03F 1/68* (2012.01)
*G03F 1/70* (2012.01)
*G03F 1/78* (2012.01)
*G03F 7/00* (2006.01)
*H01L 21/66* (2006.01)

(52) U.S. Cl.
CPC .............. *G03F 1/78* (2013.01); *G03F 7/20* (2013.01); *G03F 7/70141* (2013.01); *G03F 7/70158* (2013.01); *G03F 7/70716* (2013.01); *H01L 22/30* (2013.01)

(58) Field of Classification Search
CPC ..... G03F 1/50; G03F 1/68; G03F 1/70; G03F 1/78; H01L 22/30
USPC .... 355/52, 53, 55, 67–71, 72–77; 430/5, 22, 430/30, 311, 312, 321; 250/492.1, 492.2, 250/492.21, 492.22, 492.3, 493.1, 548, 250/427
See application file for complete search history.

(56) References Cited

U.S. PATENT DOCUMENTS

| | | | |
|---|---|---|---|
| 5,773,836 A | 6/1998 | Hartley | |
| 5,917,932 A * | 6/1999 | Hartley | G03F 7/706 430/30 |
| 6,165,692 A | 12/2000 | Kanai et al. | |
| 6,278,957 B1 | 8/2001 | Yasuda et al. | |
| 9,171,126 B1 | 10/2015 | Salazar | |
| 10,073,354 B2 | 9/2018 | Chung et al. | |
| 10,534,272 B2 * | 1/2020 | Chung | G03F 1/50 |
| 11,003,091 B2 * | 5/2021 | Chung | G03F 7/70158 |
| 2002/0040468 A1 * | 4/2002 | Uno | G03F 1/36 716/52 |
| 2003/0090638 A1 | 5/2003 | Koehler et al. | |
| 2004/0005507 A1 | 1/2004 | Lakkapragada et al. | |
| 2004/0248043 A1 | 12/2004 | Shiraishi | |
| 2005/0164098 A1 | 7/2005 | Lin et al. | |
| 2005/0233227 A1 | 10/2005 | Yang | |
| 2005/0255683 A1 | 11/2005 | Bernstein et al. | |
| 2006/0291077 A1 * | 12/2006 | Shim | G03F 7/70825 359/819 |
| 2007/0074142 A1 * | 3/2007 | Smayling | G03F 1/36 716/53 |
| 2008/0055577 A1 * | 3/2008 | Smeets | G03F 1/50 430/311 |
| 2008/0063259 A1 * | 3/2008 | Sakurai | G03F 1/36 382/151 |
| 2009/0226677 A1 * | 9/2009 | Pici | G03F 7/70366 355/53 |
| 2010/0086862 A1 * | 4/2010 | Yang | G03F 1/36 430/5 |
| 2010/0190096 A1 * | 7/2010 | Ausschnitt | G03F 1/68 430/30 |
| 2010/0209828 A1 | 8/2010 | Sentoku | |
| 2012/0046775 A1 | 2/2012 | Chien et al. | |
| 2013/0273463 A1 | 10/2013 | Wagner | |
| 2015/0278426 A1 * | 10/2015 | Ning | G03F 1/36 716/124 |

* cited by examiner

METHOD OF FABRICATING RETICLE

PRIORITY CLAIM AND CROSS-REFERENCE

This application is a continuation application of U.S. application Ser. No. 16/740,256, filed on Jan. 10, 2020, now U.S. Pat. No. 11,003,091, issued on May 11, 2021, which is a divisional application of U.S. application Ser. No. 16/127,017, filed on Sep. 10, 2018, now U.S. Pat. No. 10,534,272, issued on Jan. 14, 2020, which is a continuation application of U.S. application Ser. No. 14/706,871, filed on May 7, 2015, now U.S. Pat. No. 10,073,354, issued on Sep. 11, 2018, which claims priority to U.S. provisional application Ser. No. 62/072,250, filed on Oct. 29, 2014, all of which are hereby incorporated by reference in their entirety.

BACKGROUND

Semiconductor integrated circuit (IC) industry has experienced exponential growth. As costs have fallen quickly and functionality has risen dramatically, powerful circuits are now available at low cost for a wide range of use. Improvements in optical lithography have been the driving force behind the extraordinary advances in integrated circuit cost and performance. Therefore, many in the industry are striving to improve the optical lithography efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
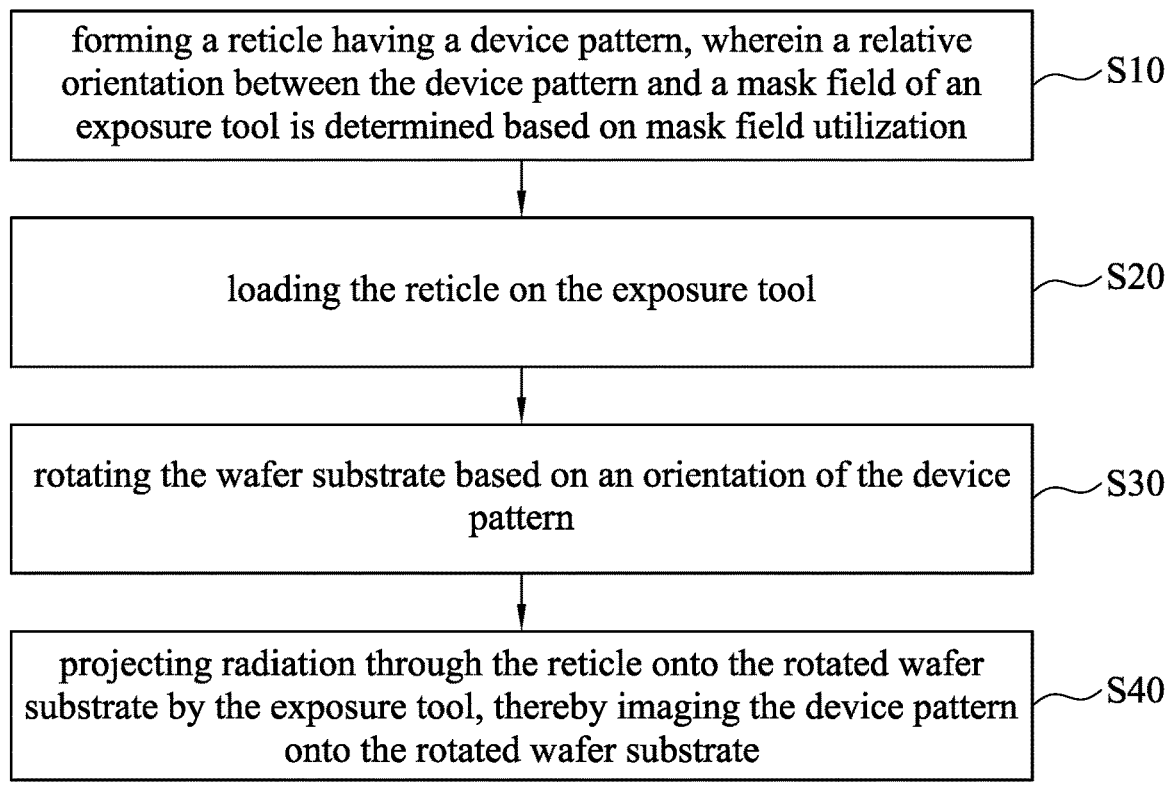
FIG. 1 is a flowchart of a method for exposing a wafer substrate in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method for exposing a wafer substrate in accordance with various embodiments of the present disclosure. As shown in operation S10, a reticle having a device pattern is formed. A relative orientation between the device pattern and a mask field of an exposure tool is determined based on mask field utilization. In other words, the relative orientation between the device pattern and the mask field is adjusted based on mask field utilization. The features of the device pattern are either opaque or clear (black or white), and the device pattern herein can be transferred onto the wafer substrate to fabricate electronic devices on the wafer substrate. The mask field of the exposure tool is an area of the reticle that is exposed at one time by the exposure tool. The mask field utilization (MFU) is defined as follow:

MFU=(mask utilized area)/(mask field area), where the mask utilized area is an area of the features (for example, the device pattern) of the reticle to be transferred onto the wafer substrate at one time. In fact, reticles are typically patterned at a large size than the desired wafer pattern size. Reticle magnification factor in use are, for instance, 2×, 2.5×, 4×, 5×, and 10×. The reticle magnification factor is equal to the lens reduction factor in the exposure tool. That is, the device pattern herein is reduced by the magnification factor when imaged onto the wafer substrate.

Figure 2:
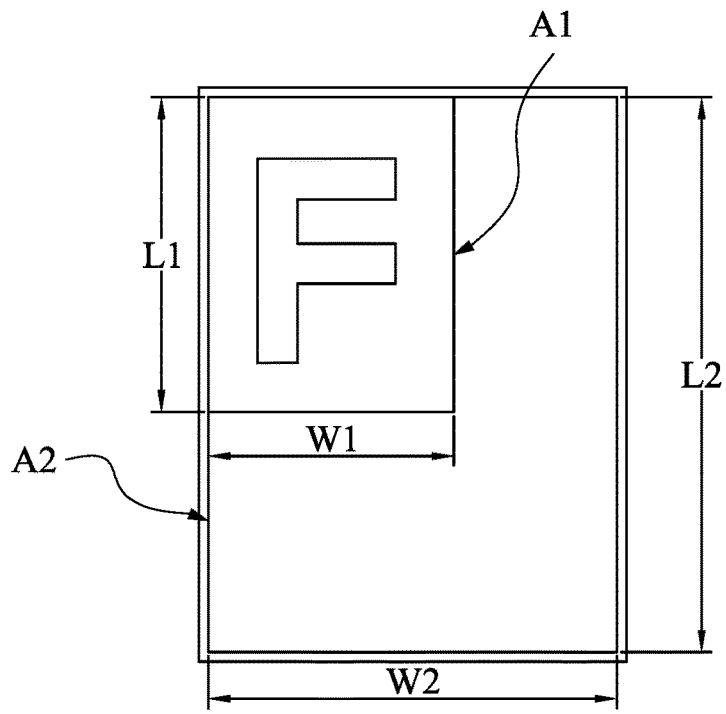
FIG. 2 is a top view of a mask utilized area and a mask field area of the reticle in accordance with various embodiments of the present disclosure.

Herein is an example of MFU calculation. FIG. 2 is a top view of a mask utilized area A1 and a mask field area A2 of the reticle in accordance with various embodiments of the present disclosure. In FIG. 2, one of the device design layout form the mask utilized area A1. The orientation of the pattern F herein defines the orientation of the device design layout. L1 and W1 are the length and width of the mask utilized area A1, and L2 and W2 are the length and width of the mask field area A2. The MFU is about 28% when L1=17 cm, W1=15 cm, L2=33 cm, and W2=26 cm. The mask utilized area A1 along vertical and horizontal directions is not greater than the mask field area A2 along the vertical and the horizontal directions, respectively.

Figure 3:
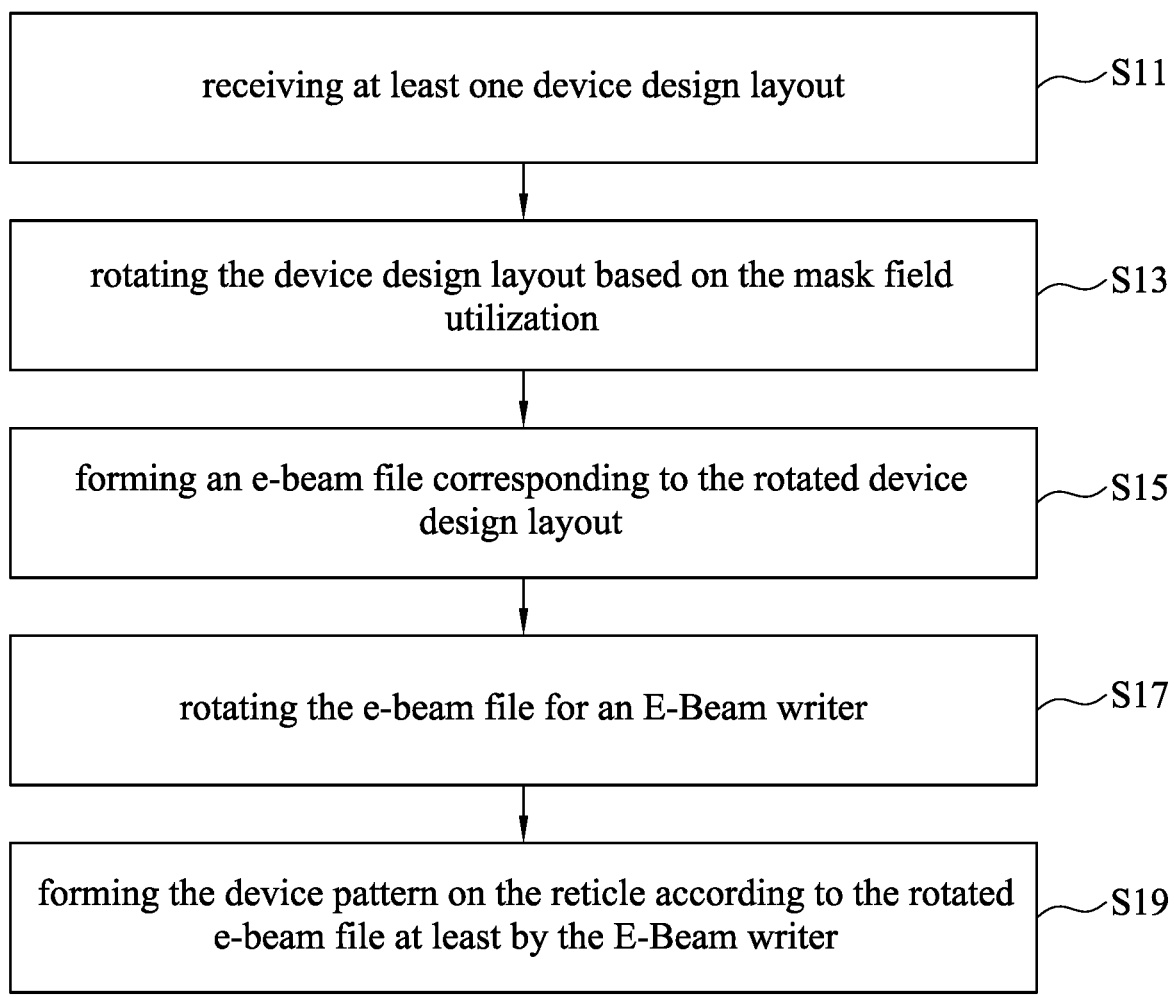
FIG. 3 is a flowchart of the operation S10 of FIG. 1 in accordance with various embodiments of the present disclosure.
Figure 4A:
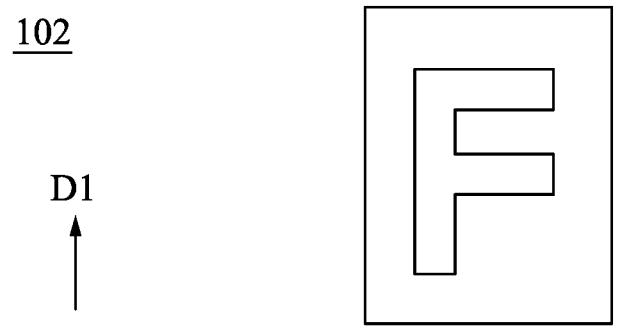
FIGS. 4A-4H are top views of the method of forming the reticle in accordance with various embodiments of the present disclosure.

Reference is made to FIG. 1. The device pattern of the reticle has a certain orientation which depends on the features thereof. The mask field, which can be rectangular, has another certain orientation. The relative orientation between the device pattern and the mask field of the exposure tool is determined (or adjusted) based on mask field utilization. The following paragraphs provide detailed explanations with respect to how to form the reticle. FIG. 3 is a flowchart of the operation S10 of FIG. 1 in accordance with various embodiments of the present disclosure, and FIGS. 4A-4H are top views of the method of forming the reticle in accordance with various embodiments of the present disclosure. Reference is made to FIGS. 3 and 4A. As shown in operation S11, at least one device design layout 102 is received. The device design layout 102 includes the description of the desired pattern features, which will make up circuit. In FIG. 4A, the device design layout 102 has an orientation, which is represented by the orientation of the pattern F, along a first direction D1.

Figure 4B:
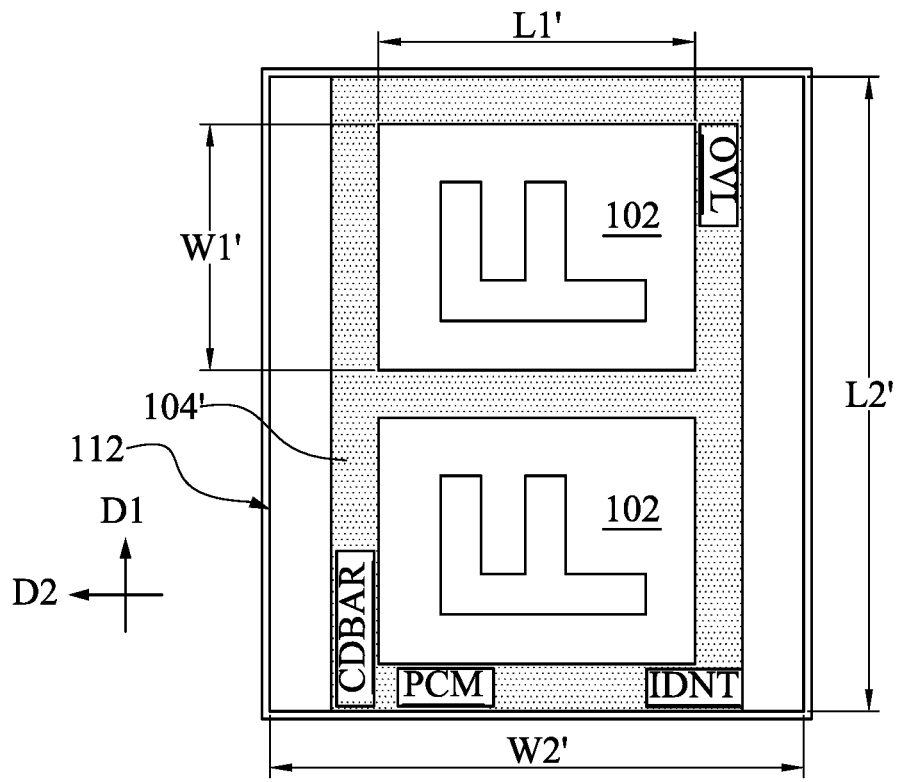

Reference is made to FIGS. 3 and 4B. As shown in operation S13, the device design layout 102 is rotated based on the mask field utilization. The mask field 112 has an orientation along the first direction D1. In FIG. 4B, L1' and W1' are the length and width of the device design layout 102, and L2' and W2' are the length and width of the mask field 112. According to different sizes of the device design layout 102, a computation can be done to get a high mask field utilization. That is, the relative orientation between the device design layout 102 and the mask field 112 is adjusted. For example, the device design layout 102 is rotated (substantially 90 degrees) counterclockwise, such that the orientation of the device design layout 102 is along a second direction D2 which is substantially perpendicular to the first direction D1. With this design, two of the device design layouts 102 can be filled in the mask field 112 of FIG. 4B. When L1'=17 cm, W1'=15 cm, L2'=33 cm, and W2'=26 cm, the MFU of the rotated device patterns 102 is increased to 56%, which is twice the MFU of the unrotated device pattern 102 (since one of the unrotated device design layouts 102 is accommodated in the mask field 112).

In some embodiments, a scribe line design layout 104 (see FIG. 4C) is generated. For example, a default scribe line design layout 104' is disposed outside and around the device patterns 102. The default scribe line design layout 104' is formed to be a scribe line pattern of the reticle, which can be transferred onto the wafer substrate to fabricate scribe lines on the wafer substrate. A cutting operation utilizes a cutter to cut the wafer substrate into individual dies along the scribe lines.

In some embodiments, the default scribe line design layout 104' includes an overlay pattern OVL, a critical dimension bar pattern CDBAR, a process control monitor pattern PCM, an identification pattern IDNT, a frame cell (not shown), and a wafer acceptance test pattern (not shown). The overlay pattern OVL is used to align multiple layers formed on the wafer substrate. The critical dimension bar CDBAR is designed to measure the dimensions of critical processes in the fabrication of a semiconductor device. The process control monitor pattern PCM includes such for measuring electrical parameters of active devices (threshold voltage, gate diode breakdown, channel length/width reduction, drain/source series resistance, etc), properties of passive devices (area capacitances, sheet resistance, contact/via resistance, etc.) and inline relevant parameters such as linewidth control, alignment, etc. The identification pattern IDNT is transformed to be an identification of the wafer substrate. In FIG. 4B, the overlay pattern OVL is disposed at the right portion of the default scribe line design layout 104', the critical dimension bar pattern CDBAR is disposed at the left portion of the default scribe line design layout 104', and the process control monitor pattern PCM and the identification pattern IDNT are disposed at the bottom portion of the default scribe line design layout 104'. However, the positions of the overlay pattern OVL, the critical dimension bar pattern CDBAR, the process control monitor pattern PCM, and the identification pattern IDNT are illustrated and not limits the claimed scope of the present disclosure.

Figure 4C:
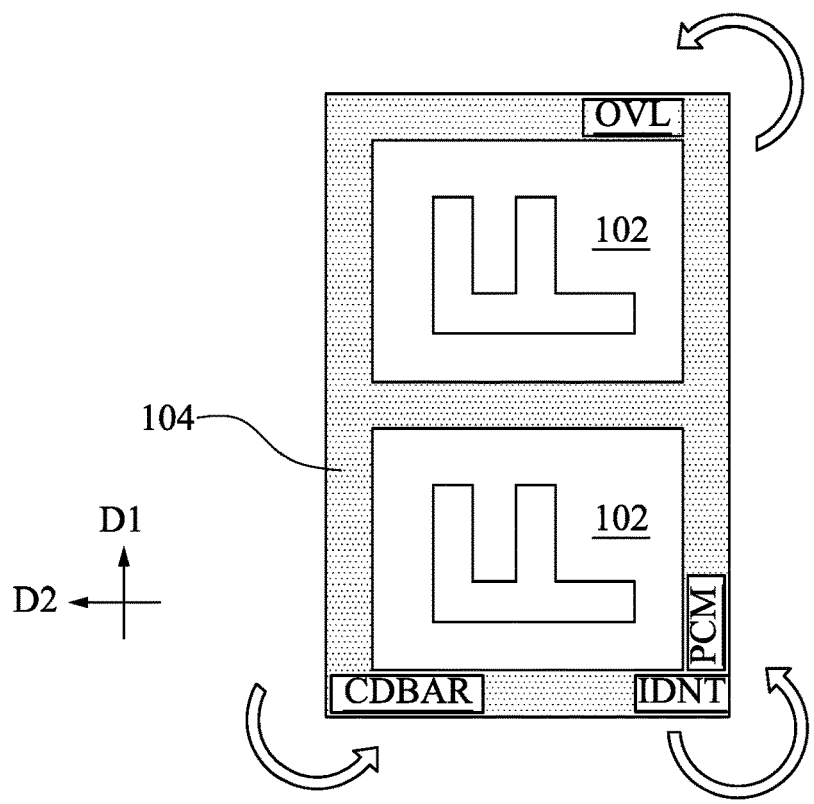

Reference is made to FIG. 4C. Since the device pattern 102 has been rotated, the at least one of the overlay pattern OVL, the critical dimension bar pattern CDBAR, the process control monitor pattern PCM, and the identification pattern IDNT is rotated accordingly to regenerate the scribe line design layout 104. For example, in FIG. 4C, the overlay pattern OVL, the critical dimension bar pattern CDBAR, the process control monitor pattern PCM are individually rotated. The overlay pattern OVL is rotated counterclockwise and is instead disposed at the top portion of the scribe line design layout 104, the critical dimension bar pattern CDBAR is rotated counterclockwise and is instead disposed at the bottom portion of the scribe line design layout 104, the process control monitor pattern PCM is rotated counterclockwise and is instead disposed at the right portion of the scribe line design layout 104, and the position of the identification pattern IDNT is unchanged.

Figure 4D:
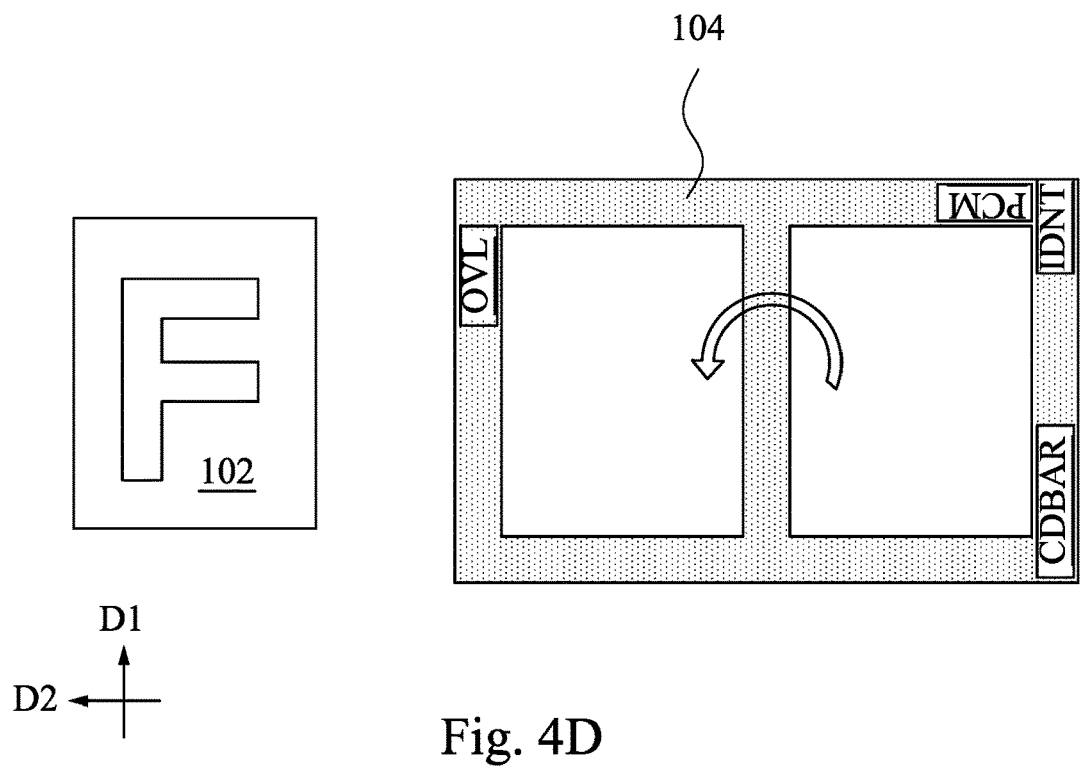

Reference is made to FIG. 4D. After being generated, the scribe line design layout 104 is rotated substantially 90 degrees counterclockwise. Subsequently, an optical proximity correction (OPC) process is individually performed on the unrotated device design layout 102 and the rotated scribe line design layout 104. Optical proximity correction is a photolithography enhancement technique commonly used to compensate for image errors due to diffraction or process effects. It is widely used in wafer lithography to produce a printed image that matches the design intent while optimizing critical dimension control. Optical proximity correction improves image fidelity by adding and subtracting small enhancement shapes from the original pattern data.

Figure 4E:
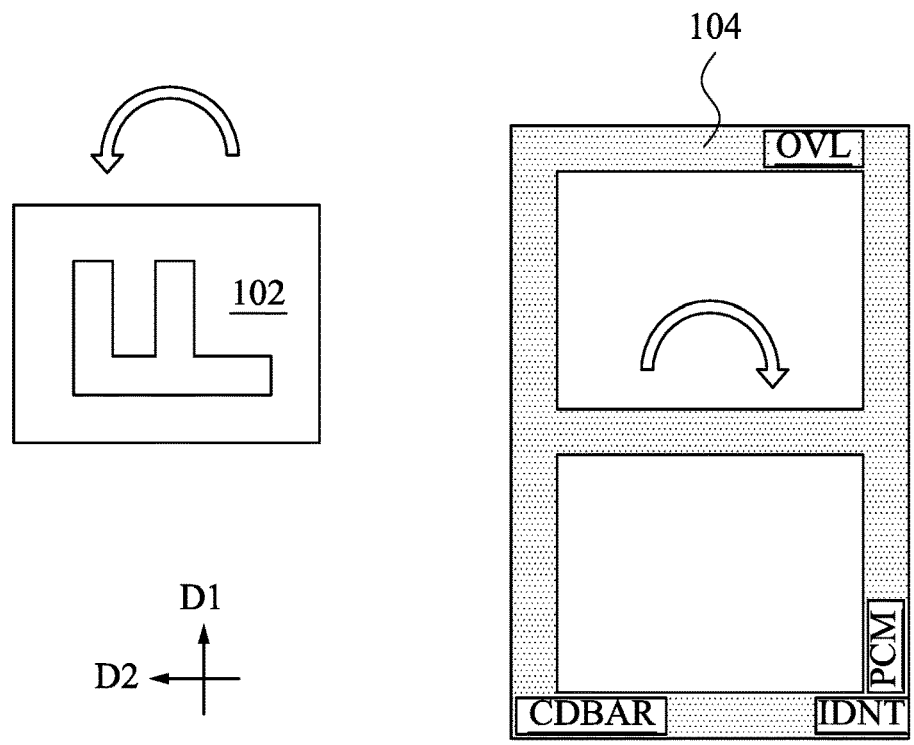

Reference is made to FIG. 4E. After the optical proximity correction process is performed, both of the device design layout 102 and the scribe line design layout 104 are rotated again, such that their orientations are the same as in FIG. 4C. For clarity, the correction patterns of OPC are not shown in FIG. 4E. In FIG. 4E, the device design layout 102 is rotated substantially 90 degrees counterclockwise, and the scribe line design layout 104 is rotated substantially 90 degrees clockwise.

Figure 4F:
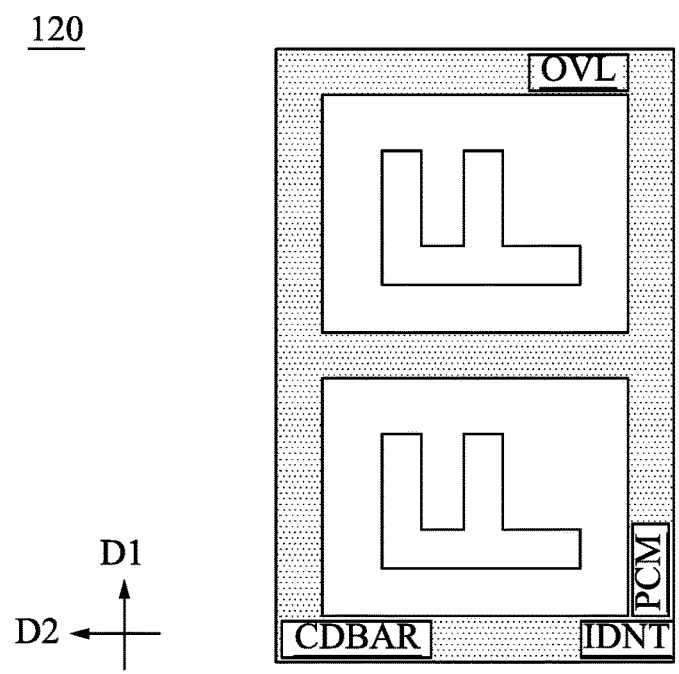

Reference is made to FIGS. 3 and 4F. As shown in operation S15, an e-beam file 120 is formed corresponding to the rotated device design layout 102 of FIG. 4E. Simultaneously, the scribe line design layout 104 of FIG. 4E is combined with the rotated device design layout 102 to form the e-beam file 120.

Figure 4G:
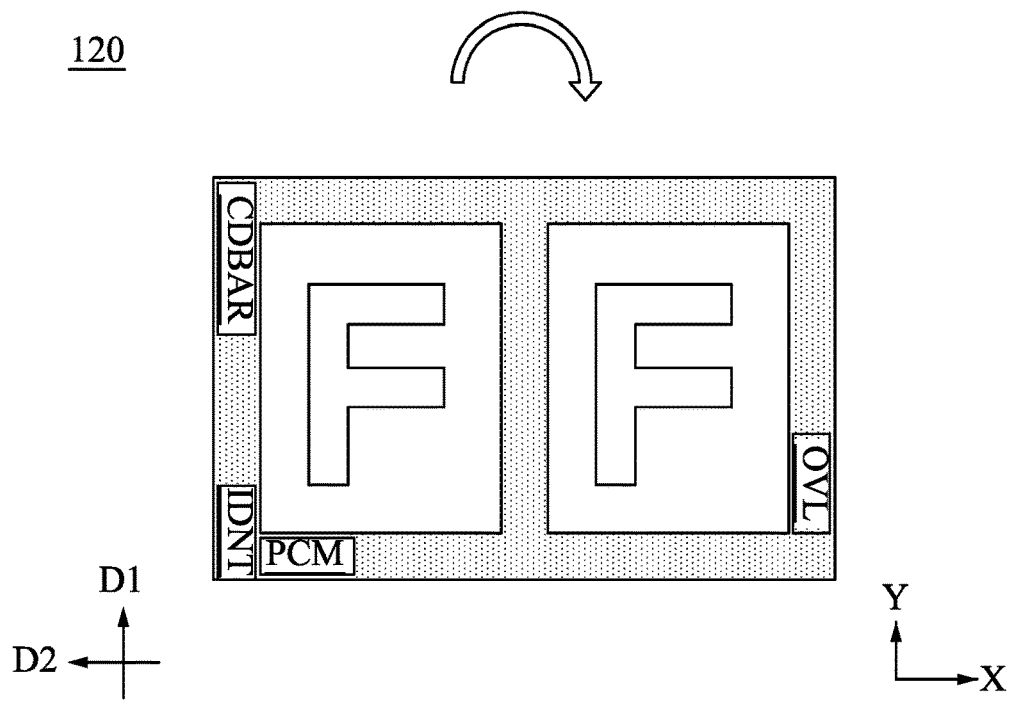

Reference is made to FIGS. 3 and 4G. As shown in operation S17, the e-beam file 120 is rotated for an E-Beam writer. For example, in FIG. 4G, the e-beam file 120 is rotated substantially 90 degrees clockwise. In this configuration, the orientation of the device design layout 102 (see FIG. 4E) is along the first direction D1.

Figure 4H:
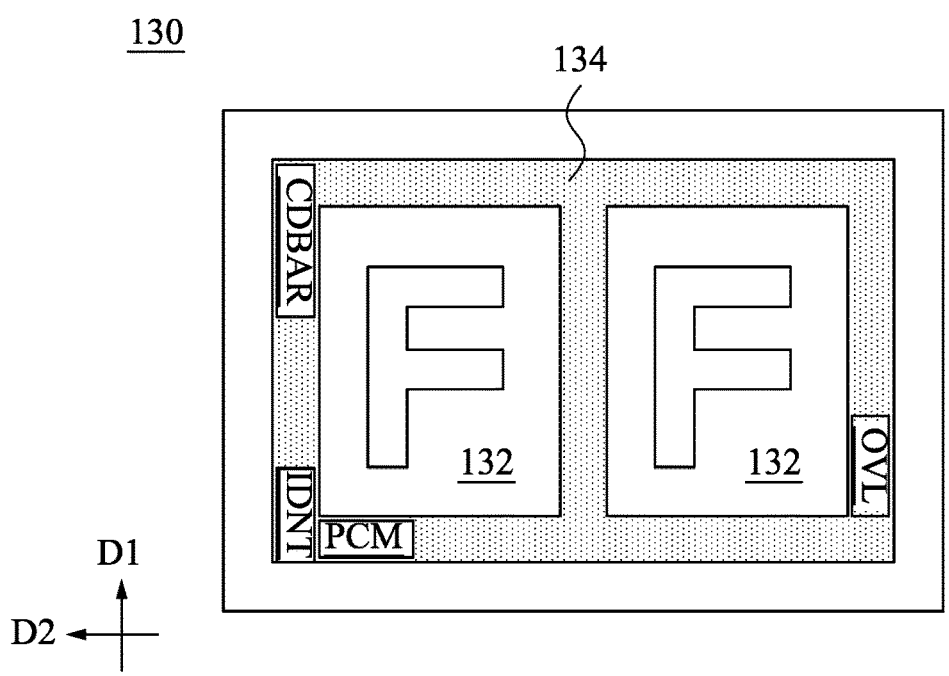

Reference is made to FIGS. 3 and 4H. As shown in operation S19, the device patterns 132 and the scribe line pattern 134 are formed on the reticle 130 according to the e-beam file 120 at least by the E-Beam writer. That is, the device design layout 102 of FIG. 4E is transferred to be the device pattern 132, and the scribe line design layout 104 of FIG. 4E is transferred to be the scribe line pattern 134. After the operation S19, the manufacturing of the reticle 130 is complete.

Figure 5:
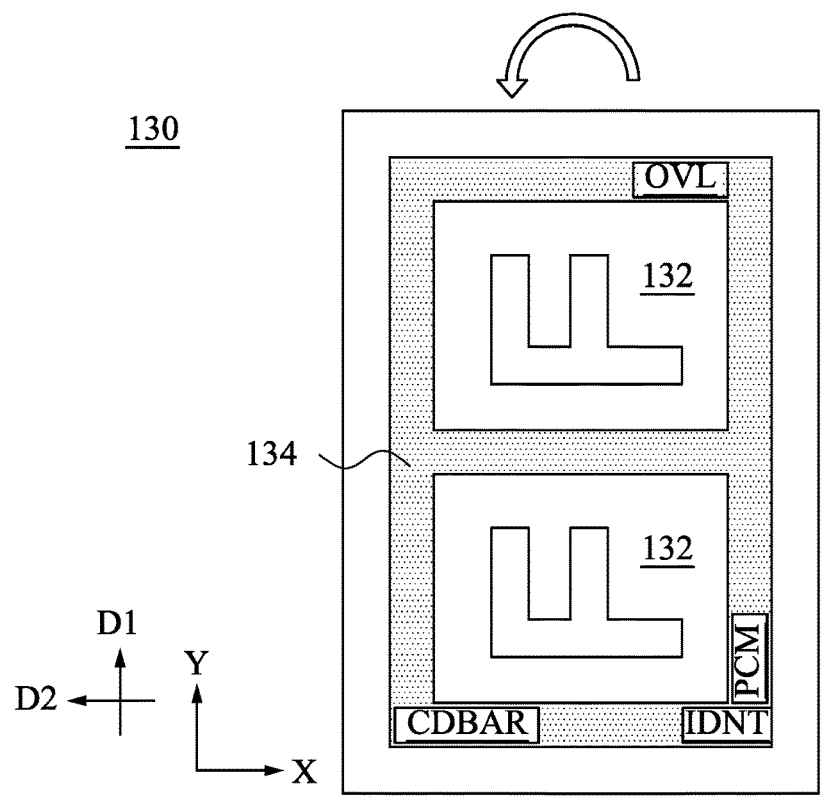
FIG. 5 is a top view of the reticle of FIG. 4H disposed on the exposure tool.

FIG. 5 is a top view of the reticle 130 of FIG. 4H disposed on the exposure tool. Reference is made back to FIGS. 1 and 5. As shown in operation S20, the reticle 130 is loaded on the exposure tool. In FIG. 5, the reticle 130 of FIG. 4H is rotated substantially degrees counterclockwise, such that the orientation of the device patterns 132 are along the second direction D2. On the other hand, as mentioned above, the orientation of the mask field of the exposure tool is along the first direction D1.

Figure 6:
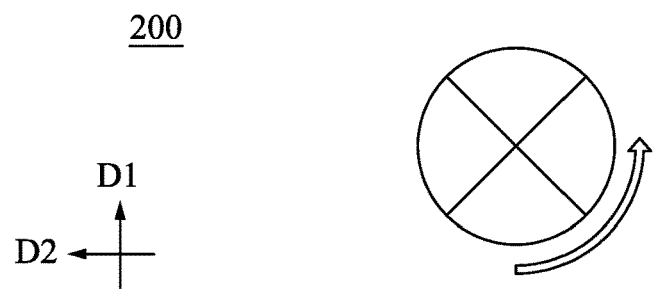
FIG. 6 is a top view of an illumination optical device of the exposure tool in accordance with various embodiments of the present disclosure.

FIG. 6 is a top view of an illumination optical device 200 of the exposure tool in accordance with various embodiments of the present disclosure. Reference is made back to FIGS. 1 and 6. In general, illumination intensity profile is spatially different. Therefore, the orientation of the illumination optical device 200 is adjusted according to the orientation of the device pattern 132 of FIG. 5. In FIG. 6, since the device pattern 132 of FIG. 5 has been rotated substantially 90 degrees counterclockwise, the illumination optical device 200 is rotated substantially 90 degrees counterclockwise accordingly to be configured to project the radiation. In some embodiments, the illumination optical device 200 includes refractive and/or diffractive optical elements (DOEs) for offering numerous benefits such as reformed light beam shape. That is, the shape of the radiation passing through the refractive and/or diffractive optical elements is reformed.

Figure 7:
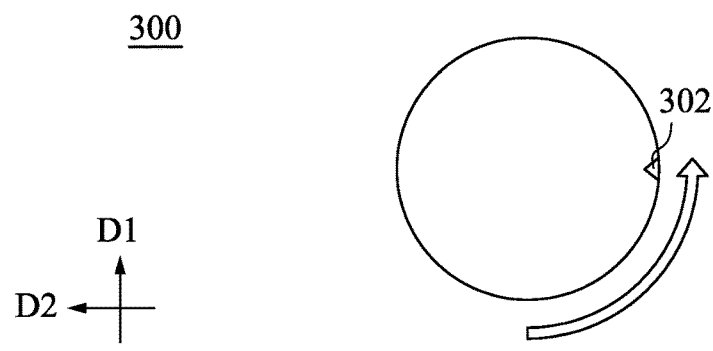
FIG. 7 is a top view of the wafer substrate in accordance with various embodiments of the present disclosure.

FIG. 7 is a top view of the wafer substrate 300 in accordance with various embodiments of the present disclosure. Reference is made back to FIGS. 1 and 7. As shown in operation S30, the wafer substrate 300 is rotated based the orientation of the device pattern 132. In other words, the wafer substrate 300 is oriented according to the device pattern 132. In some embodiments, the wafer substrate 300 is made of semiconductor, sapphire, or other materials having its crystal performance. Crystal orientation is considered since many of a single crystal's structural and electronic properties are highly anisotropic. Ion implantation depths depend on the crystal orientation of the wafer substrate 300, since each direction offers distinct paths for transport. Hence, the wafer substrate 300 has a marking pattern 302 to identify the crystal orientation thereof. In FIG. 7, since the device pattern 132 of the reticle 130 of FIG. 5 has been rotated substantially 90 degrees counterclockwise, the wafer substrate 300 is rotated substantially 90 degrees counterclockwise accordingly. Hence, the marking pattern 302 is moved from the bottom side to the right side of the wafer substrate 300 in FIG. 7.

With this process, the type of the wafer substrate 300 (for example, an {110} or an {100} silicon wafer) is unchanged compared to a wafer substrate that its device pattern and itself are both unrotated. In greater detail, on a wafer substrate, due to the diamond structure of the base material of the wafer substrate 300, there is a natural cleavage direction. The cleavage direction is the direction along which the wafer substrate is likely to crack or break when under stress. Due to this feature of the wafer substrate 300, the dies (corresponding to the device pattern 132) are arranged in rows and columns so that the dicing lines coincide with the natural cleavage direction of the base material. Since both the device pattern 132 and the wafer substrate 300 are rotated in FIG. 1, the dies (corresponding to the device pattern 132) are still substantially arranged along the natural cleavage direction. Hence, the type of the wafer substrate 300 is unchanged in operation S30. Also, another type of the wafer substrate is not obligatory to be ordered when the wafer substrate 300 is rotated, which simplifies the exposing process.

Reference is made to FIGS. 1, 5-7. As shown in operation S40, radiation is projected through the reticle 130 onto the rotated wafer substrate 300 (or the wafer substrate 300 is illuminated through the reticle 130) by the exposure tool, thereby imaging the device pattern 132 onto the rotated wafer substrate 300. In the operation S40, the radiation is provided by the illumination optical device 200, i.e., the illumination optical device 200 illuminates the wafer substrate 300. The clear and opaque patterns on the reticle 130 create exposed and unexposed regions. Hence, the radiation passing through the reticle can be patterned, such that the wafer substrate 300, more specifically, a photoresist layer on the wafer substrate 300, is patterned when the patterned radiation illuminates on the wafer substrate 300. After the illuminating process, the wafer substrate 300 is moved into the next correct alignment position for field illumination. In other words, the exposure tool scans the wafer substrate 300 to exposure the entire area thereof.

Thus, since the relative orientation between the device pattern and the mask field of the exposure tool is determined (or adjusted) based on mask field utilization during forming the reticle, the mask field utilization is increased. Higher mask field utilization provides larger exposed area on the wafer substrate at one time (also called "one shot"). For a reticle having mask field utilization about 52%, 180 shots are needed to expose the entire area of a 12-inch wafer substrate. In contrast, for a reticle having mask field utilization about 96% (that is, the device pattern thereof is rotated), 97 shots are enough to expose the entire area of the same wafer substrate. Furthermore, since the move of the wafer substrate goes through speed-up and speed-down processes for one shot, which wastes exposure time, less shot number represents higher exposure efficiency.

The device design layout is oriented along the first direction in optical operations. More specifically, the device design layout is oriented along the first direction in the optical proximity correction process and in the E-Beam writing process. For the optical proximity correction, since the correction parameters along horizontal direction and vertical direction are different, the device design layout is unrotated (that is, oriented along the first direction) to get a correct correction. For E-Beam writing, since the e-beam intensity profile is spatially different, the device design layout is still unrotated to prevent the formed device pattern from deforming.

Moreover, as mentioned above, in FIGS. 5 and 6, the illumination optical device 200 is rotated based on the rotated device pattern 132 of the reticle 130. That is, the illumination optical device 200 is rotated when the device pattern 132 is rotated. On the other hand, as the E-Beam source of the E-Beam writer is not rotated, the device design layout is unrotated while the scribe line design layout is rotated during the E-Beam writing process. Therefore, the optical proximity correction corrects unrotated device design layout and rotated scribe line design layout. Furthermore, the E-Beam writer and the exposure tool have the same coordinate system, as shown in FIGS. 4G and For example, the horizontal coordinates of the E-Beam writer and the exposure tool are X-axis while the vertical coordinates of the E-Beam writer and the exposure tool are Y-axis. Therefore, there is no complex coordinate transform between the exposure operation and the E-Beam writing operation.

Figure 8:
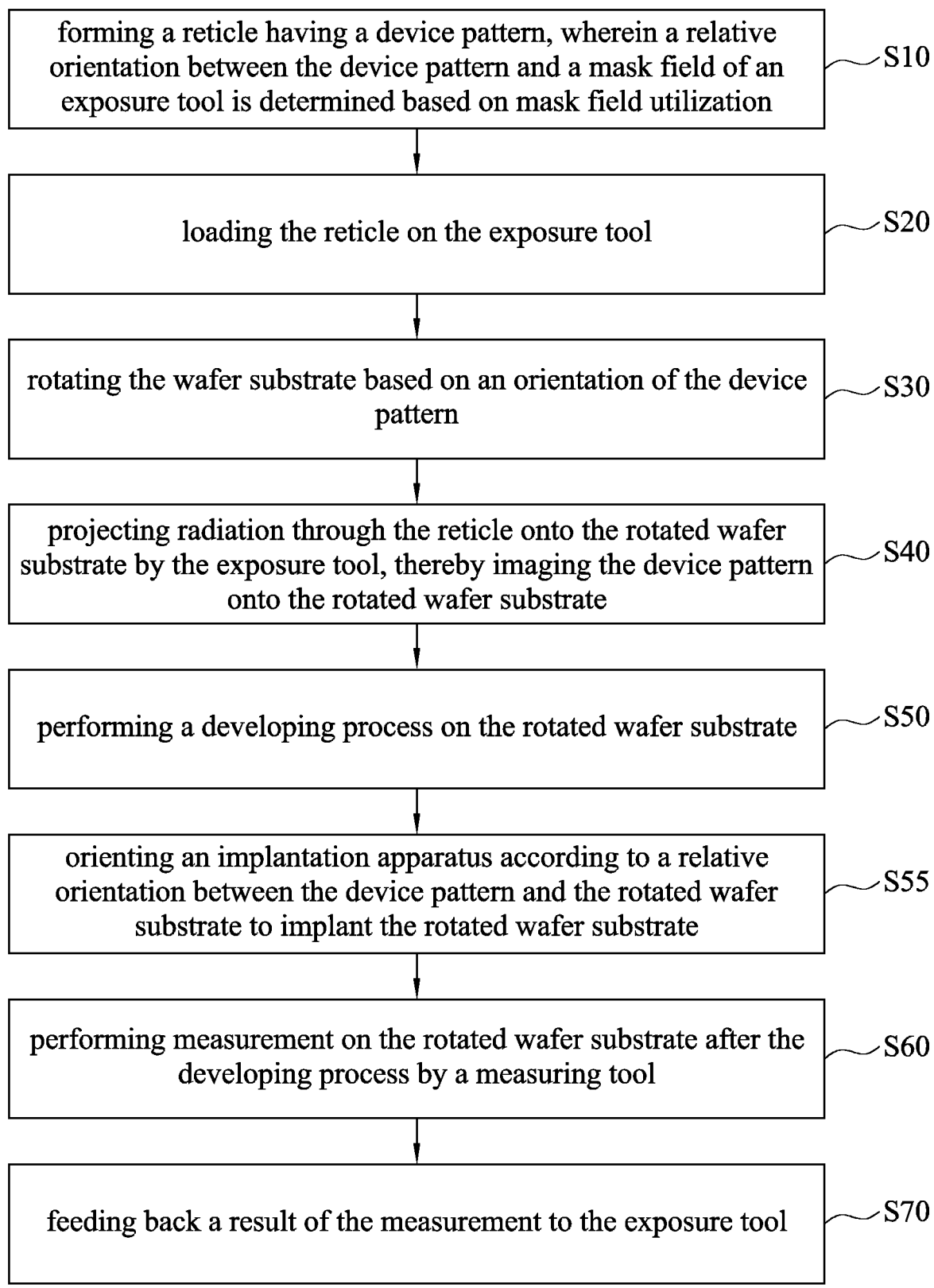
FIG. 8 is a flowchart of a method for manufacturing a semiconductor device in accordance with various embodiments of the present disclosure.

FIG. 8 is a flowchart of a method for manufacturing a semiconductor device in accordance with various embodiments of the present disclosure. Since the operation details are similar to FIG. 1, and, therefore, a description in this regard will not be repeated hereinafter. After the operation S40, a developing process is performed on the rotated wafer substrate 300 (see FIG. 7), as shown in operation S50. In greater detail, after the wafer substrate 300 (more specifically, the photoresist layer on the wafer substrate 300) is illuminated, the photochemistry of the photoresist layer creates large solubility differences between the exposed and unexposed regions to an aqueous developing solution, i.e., developer. During development, the highly soluble resist areas are selectively dissolved away to produce the photoresist pattern. The wafer substrate 300 is then rinsed in water to remove the developer solution completely.

In some embodiments, after the operation S50, an implantation apparatus is oriented according to a relative orientation between the device pattern and the rotated wafer substrate, as shown in operation S55. The implantation apparatus is configured for providing a plurality of ions to the wafer substrate through the developed photoresist pattern. In FIG. 8, since both the device pattern and the wafer substrate have been rotated (for example, about 90 degrees) along the same direction, the relative orientation between the device pattern and the rotated wafer substrate is substantially the same when they are both unrotated. Therefore, the orientation of the implantation apparatus of operation S50 is substantially the same as an implantation apparatus implanting a general wafer substrate that its device pattern and itself are both unrotated. Therefore, no additional calibration process is done to the implantation apparatus, which simplifies the implantation process. In some other embodiments, however, the operation S55 is omitted after the operation S50, and the claimed scope of the present invention is not limited in this respect.

Figure 9:
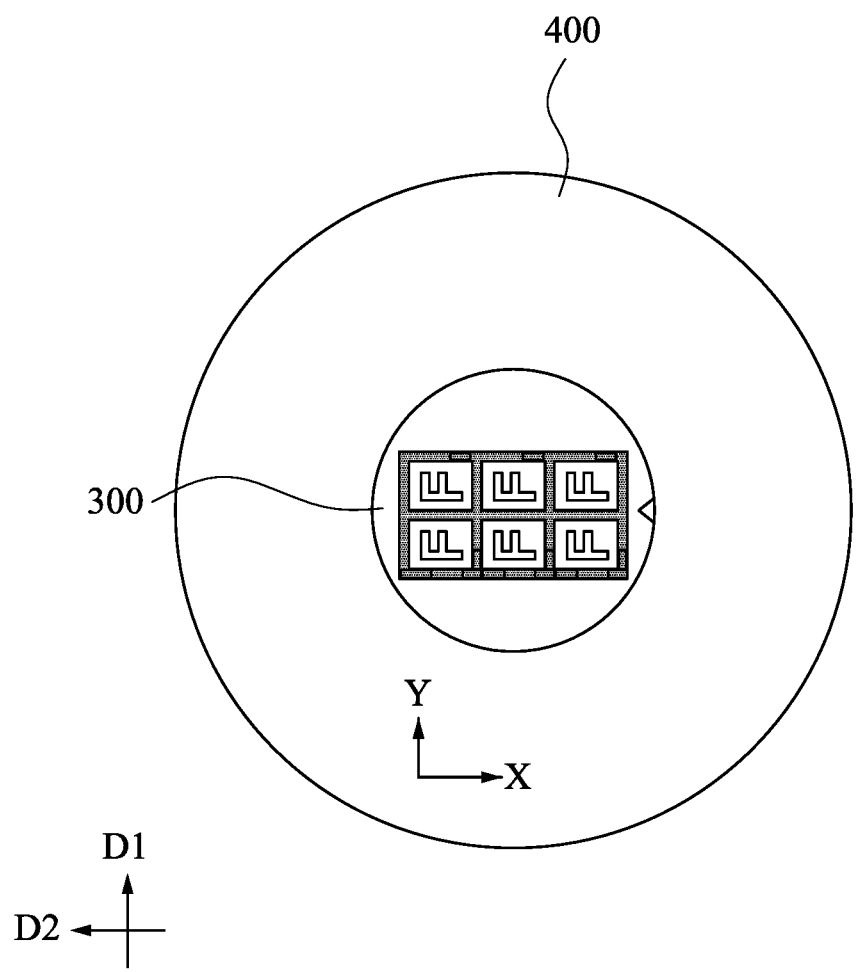
FIG. 9 is a top view of the wafer substrate on a stage of a measuring tool.

FIG. 9 is a top view of the wafer substrate 300 on a stage 400 of a measuring tool. Reference is made to FIGS. 8 and 9. In some embodiments, a measurement can be performed on the rotated wafer substrate 300 after the developing process by a measuring tool, as shown in operation S60. The measurement can be overlay measurement or critical dimension measurement. The overlay measurement measures whether the device pattern formed on the wafer substrate 300 is aligned to the pattern of a previously patterned layer. The critical dimension measurement measures the critical dimensions of the device pattern (or the photoresist pattern) formed on the wafer substrate 300. The measuring tool for measuring the critical dimension can be a scanning electron microscopy (SEM).

In operation S60, the exposure tool and the measuring tool have the same coordinate system. In greater detail, as shown in FIG. 5, the horizontal coordinate of the measuring tool is X-axis while the vertical coordinate of the measuring tool is Y-axis. On the other hand, in FIG. 9, the horizontal coordinate of the measuring tool is X-axis while the vertical coordinate of the measuring tool is Y-axis. Therefore, there is no complex coordinate transform between the exposure operation and the measurement operation.

Reference is made to FIG. 8. As shown in operation S70, a result of the measurement is fed back to the exposure tool. If a problem is identified from the measurement result, the exposure tool provides amendment processes, such as removing and reworking the photoresist layer if the photoresist layer is still on the wafer substrate 300, or the critical dimension result can be feedback back to the exposure tool to be corrected in what is called the Dose Mapper (DOMA) process. If the measurement has been completed with suitable results, the wafer substrate 300 (see FIG. 9) is allowed to continue on to the next process.

Figure 10A:
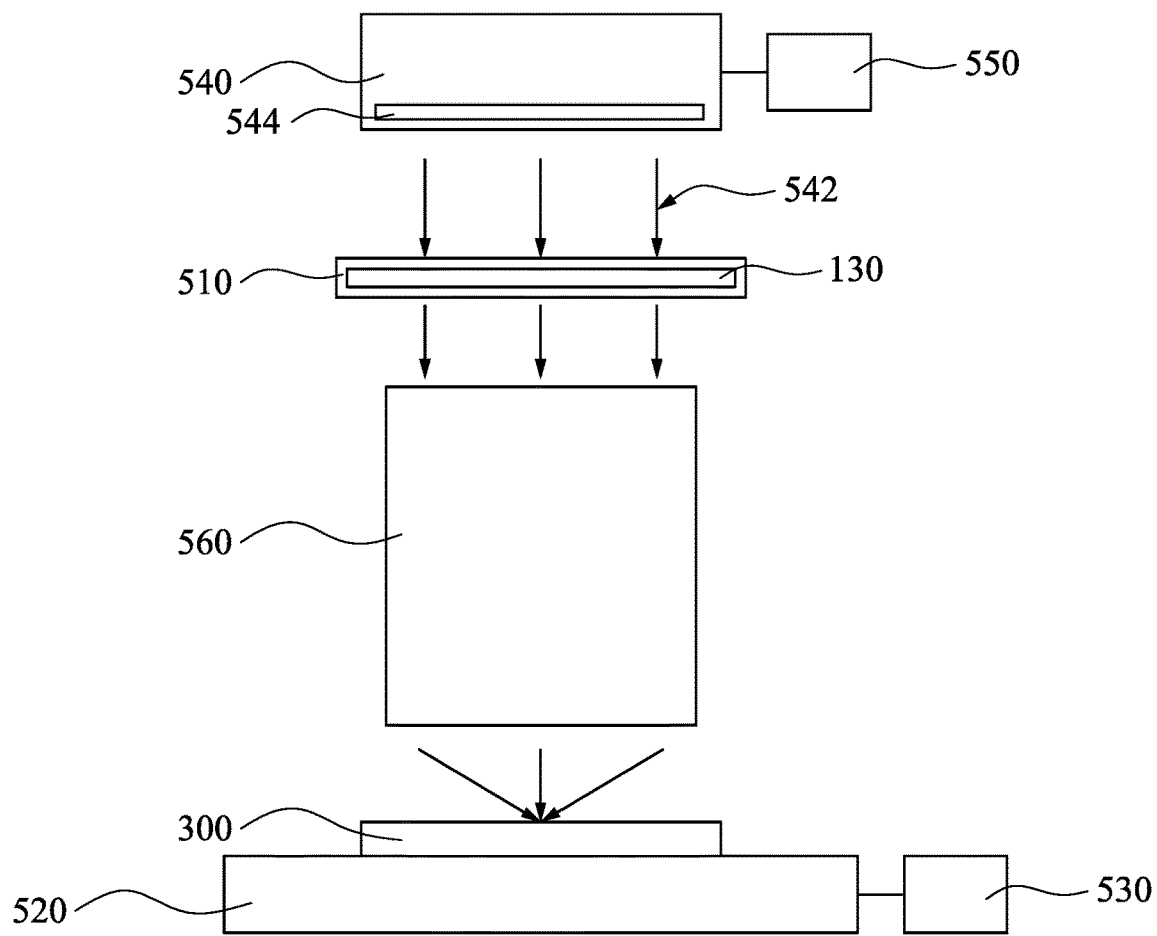
FIG. 10A is a schematic diagram of an exposure tool in accordance with various embodiments of the present disclosure.
Figure 10B:
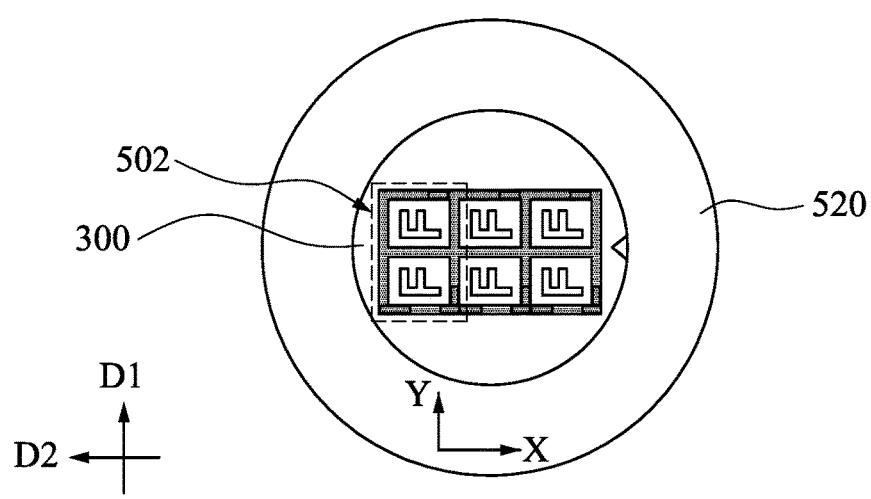
FIG. 10B is a top view of a stage and a wafer substrate of FIG. 10A.

FIG. 10A is a schematic diagram of an exposure tool in accordance with various embodiments of the present disclosure, and FIG. 10B is a top view of a stage 520 and a wafer substrate 300 of FIG. 10A. The exposure tool has a mask field 112 (see FIG. 4B), and includes a reticle holder 510, a stage 520, a wafer rotating mechanism 530, and an illumination optical device 540. In FIG. 10B, the mask field 112 of the exposure tool forms a corresponding exposed area 502 on the wafer 300. The reticle holder 510 is configured to hold a reticle 130 having at least one device pattern 132 (see FIG. 5) oriented based on mask field utilization. The stage 520 is configured to support the wafer substrate 300. The wafer rotating mechanism 530 is configured to rotate the wafer substrate 300 based on an orientation of the device pattern 132 which is represented by the orientation of pattern F (see FIG. 5) thereof. The illumination optical device 540 is configured to project radiation 542 through the reticle 130 onto the wafer substrate 300, thereby imaging the device pattern 132 onto the wafer substrate 300.

In some embodiments, the exposure tool further includes an illumination rotating mechanism 550 configured to rotate the illumination optical device 540 based on the orientation of the device pattern 132. Therefore, when the device pattern 132 of the reticle 130 is rotated during the manufacturing process, the illumination rotating mechanism 550 can rotate the illumination optical device 540 accordingly.

In FIG. 10A, the illumination optical device 540 includes diffractive optical elements (DOEs) 544 for reforming the shape of the radiation 542. In some embodiments, the illumination rotating mechanism 550 rotates the diffractive optical element patterns 544 of the illumination optical device 540 so as to rotate the spatial distribution of the radiation 542.

In some embodiments, the exposure tool further includes a projection lens 560 disposed between the reticle holder 510 and the stage 520. The projection lens 560 is configured to projecting the radiation 542 passing through the reticle 130 to the wafer substrate 300. In greater detail, the radiation of the illumination optical device 540 passes through the projection lens 560 to the wafer substrate 300. Therefore, the power or the numerical aperture (N/A) of the projection lens 560 determines the size of the exposed area 502 on the wafer substrate 300.

Thus, according to the aforementioned embodiments, since the relative orientation between the device pattern and a mask field of an exposure tool is determined based on mask field utilization during forming the reticle, the mask field utilization is increased. Higher mask field utilization provides larger exposed area on the wafer substrate at one time, and reduces shots number of exposure. Less shot number represents higher exposure efficiency. Furthermore, since the wafer substrate is rotated based on the orientation of the device design layout, the manufactured semiconductor devices using the manufacturing method mentioned above has substantially the same performance as a semiconductor device produced using unrotated device design layout and unrotated wafer substrate.

In some embodiments, a method includes receiving a device design layout, rotating the device design layout based on mask field utilization, and forming a reticle having the device design layout after rotating the device design layout.

In some embodiments, a method includes generating an overlay pattern for a device design layout, rotating the overlay pattern, and forming a reticle having the device design layout and the overlay pattern after rotating the overlay pattern.

In some embodiments, a method includes receiving an e-beam file having a device design layout, rotating the device design layout of the e-beam file, and forming a reticle based on the rotated device design layout of the e-beam file.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a device design layout;
    rotating the device design layout in a first direction;
    providing a scribe line design layout to surround the rotated device design layout;
    rotating the scribe line design layout in the first direction;
    after rotating the scribe line design layout in the first direction, performing an optical proximity correction (OPC) process on the unrotated device design layout and the rotated scribe line design layout; and
    forming a reticle comprising the device design layout and the scribe line design layout after performing the OPC process.

2. The method of claim 1, further comprising:
    rotating the device design layout and the scribe line design layout in different directions after performing the OPC process and prior to forming the reticle.

3. The method of claim 1, further comprising:
    rotating the reticle; and
    projecting radiation through the rotated reticle onto a wafer.

4. The method of claim 3, further comprising:
    rotating the wafer prior to projecting the radiation through the rotated reticle onto the wafer.

5. The method of claim 3, wherein projecting the radiation is performed using an illumination optical device.

6. The method of claim 5, wherein rotating the illumination optical device prior to projecting the radiation.

7. The method of claim 6, wherein rotating the illumination optical device comprises:
    rotating diffractive optical elements of the illumination optical device.

8. A method, comprising:
    receiving a device design layout and a scribe line design layout to surround the device design layout;
    performing an optical proximity correction (OPC) process on the device design layout and the scribe line design layout;
    after performing the OPC process, rotating the scribe line design layout; and
    after rotating the scribe line design layout, forming a reticle comprising the device design layout and the scribe line design layout.

9. The method of claim 8, further comprising:
    after performing the OPC process, rotating the device design layout.

10. The method of claim 9, wherein the device design layout and the scribe line design layout are rotated in different directions.

11. The method of claim 8, further comprising:
    prior to performing the OPC process, rotating the scribe line design layout.

12. The method of claim 11, wherein the scribe line design layout is rotated in different directions prior to and after performing the OPC processes.

13. The method of claim 8, further comprising:
    rotating the reticle.

14. The method of claim 13, further comprising:
    rotating a wafer; and
    projecting radiation through the rotated reticle onto the rotated wafer.

15. A method, comprising:
    receiving a device design layout;
    rotating the device design layout in a first direction;
    generating a scribe line design layout to surround the rotated device design layout;
    after generating the scribe line design layout, performing an optical proximity correction (OPC) process on the unrotated device design layout;
    after performing the OPC process, rotating the unrotated device design layout in the first direction again; and
    after rotating the unrotated device design layout in the first direction again, forming a reticle comprising the device design layout.

16. The method of claim 15, wherein the scribe line design layout comprises an overlay pattern, a critical dimension bar pattern, a process control monitor pattern, and an identification pattern, and the method further comprises:
    rotating at least one of the overlay pattern, the critical dimension bar pattern, the process control monitor pattern, and the identification pattern relative to the device design layout prior to performing the OPC process.

17. The method of claim 16, wherein after performing the OPC process, rotating the scribe line design layout.

18. The method of claim 16, wherein the at least one of the overlay pattern, the critical dimension bar pattern, the process control monitor pattern, and the identification pattern are rotated in the first direction.

19. The method of claim 15, further comprising rotating the reticle.

20. The method of claim 19, further comprising:
    rotating a radiation source; and
    projecting radiation, provided by the rotated radiation source, through the rotated reticle onto a wafer.

* * * * *